United States Patent [19]

Fisher

[11] 4,282,266
[45] Aug. 4, 1981

[54] METHOD FOR DETERMINING SILICON CONTENT IN LAYERS OF ALUMINUM AND SILICON

[75] Inventor: Albert W. Fisher, East Amwell Township, Hunterdon County, N.J.

[73] Assignee: RCA Corporation, New York, N.Y.

[21] Appl. No.: 154,598

[22] Filed: May 29, 1980

[51] Int. Cl.³ .......................... B05D 5/12; C23F 1/00
[52] U.S. Cl. ..................................... 427/9; 156/626; 156/656; 156/665; 252/79.3; 427/92; 427/405; 427/436
[58] Field of Search ............... 252/79.3; 156/656, 635, 156/626, 665; 427/9, 88, 89, 98, 90, 92, 404, 405, 430 R, 430 A, 435, 437, 436

[56] References Cited

U.S. PATENT DOCUMENTS

| 3,669,734 | 6/1972 | Jacob et al. | 427/92 X |
| 3,672,964 | 6/1972 | Bellis | 427/92 X |

Primary Examiner—William A. Powell
Attorney, Agent, or Firm—Birgit E. Morris; Donald S. Cohen; Sanford J. Asman

[57] ABSTRACT

The method provides an extremely fast and non-destructive method for determining whether an integrated circuit will have good bonding characteristics. The method entails immersion plating of copper onto aluminum areas. Then, the aluminum areas are observed visually to see if the copper plated thereon is continuous or discontinuous. If the copper is discontinuous, the aluminum film will have good bonding characteristics.

4 Claims, 2 Drawing Figures

METHOD FOR DETERMINING SILICON CONTENT IN LAYERS OF ALUMINUM AND SILICON

BACKGROUND OF THE INVENTION

Aluminum is used extensively in the semiconductor industry to provide interconnections on integrated circuits. Devices which utilize aluminum interconnections are generally heated to about 450° C. in an inert atmosphere to cause silicon to dissolve into the aluminum, while also dissolving any silicon dioxide ($SiO_2$) at the aluminum-silicon interface, thereby to insure good ohmic contact between the aluminum and the silicon. As aluminum does not dissolve uniformly over the entire contact area, "alloy spiking" results. The term "alloy spiking" means that alloys of silicon and aluminum form pits in the silicon surface which sometimes penetrate to the underlying PN junction, shorting the junction and making the circuit inoperative.

The amount of silicon which dissolves into the aluminum film, and consequently, the amount of "alloy spiking", is determined by the solid solubility of silicon in aluminum at any given temperature. For example, only about 0.6% silicon will dissolve into aluminum at 450° C. In order to prevent "alloy spiking" while insuring good bonding, aluminum films containing controlled amounts of silicon, exceeding the solid solubility limit, are deposited. Therefore, when the alloy step, i.e. the heating step, is performed, excessive, "alloy spiking" will not result. Unfortunately, the presence of silicon in the aluminum films makes the aluminum harder, so it becomes difficult to bond wires to the contact pads.

In addition, silicon precipitates out of the aluminum-silicon solution non-uniformly during cooling. As a result, bonding problems occur when the silicon precipitates out of the solution at the top of the aluminum film. The higher the percentage of silicon in the top surface, the more difficult it is to have good wire bonds to that surface.

Heretofore it has not been possible to determine whether the presence of silicon in the aluminum layer has been the cause of poor wire bonding in specific situations.

SUMMARY OF THE INVENTION

In accordance with the present invention a simple, inexpensive method of determining the presence of high concentrations of silicon in a composite silicon-aluminum layer is described. The method entails the immersion plating of copper onto unprotected bond pad areas, i.e. exposed areas of the aluminum interconnect layer to which wires will be bonded. I have found that copper plates only onto the silicon particles. Accordingly, if there are relatively few particles of silicon there will be only partial plating. However, a high percentage of silicon in the aluminum areas will result in the plating of a continuous copper layer.

Tests which have been conducted by me on samples of integrated circuits have "good-bond" characteristics and "poor-bond" characteristics show that a continuous layer of copper will plate onto the "poor-bond" devices while the "good-bond" devices will be only partially plated.

DETAILED DESCRIPTION OF AN EXEMPLARY EMBODIMENT

In accordance with the present invention, the amount of silicon which is dissolved in an aluminum film can be determined to a degree sufficient to provide information as to whether the aluminum film will have good or bad wire bonding characteristics. The method of the present invention can be performed in a short period of time without damaging the wafer which is being tested. In accordance with the invention, a wafer on which semiconductor devices has been formed and which is otherwise ready for the bonding step is placed into an immersion plating bath which selectively plates copper onto silicon in the aluminum layer while chemically etching the aluminum layer.

Following the immersion plating step, the bond pad areas, i.e. the exposed portions of the aluminum layer, may be examined visually under a microscope. If there are isolated copper areas present, then the aluminum layer will have good bonding characteristics. On the other hand, if the copper portions are interconnected or continuous, then there is too much silicon present in the aluminum layer, and it will have bad bonding characteristics.

Following the immersion plating of copper onto the aluminum layer, the copper may be removed by dipping the integrated circuit into a nitric acid bath. Then, the integrated circuit is washed to remove the nitric acid, thereby providing a fast, non-destructive test of the bonding characteristics of the aluminum layer.

Figure 1:
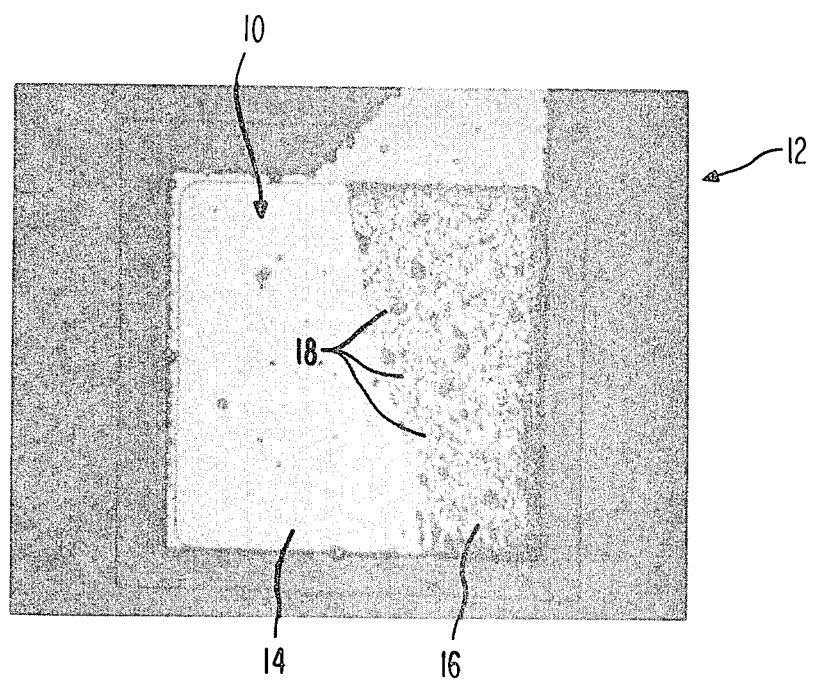
FIG. 1 is a microphotograph of an integrated circuit bond pad area showing an aluminum surface which has good bonding qualities.

Referring now to the drawing, FIG. 1 is a microphotograph of a bond pad 10 of an integrated circuit 12. The bond pad 10 has been divided into a left portion 14 and a right portion 16 by coating the left portion with a wax which acts as a protective mask during the course of carrying out the method of the present invention. Accordingly, when the integrated circuit 12 was subjected to the immersion plating step of the present invention, only the right portion 16 reacted with the immersion plating solution. The right portion 16 has numerous isolated copper areas 18 present therein. Those areas 18 are discontinuous. Accordingly, the bond pad 10 will have good bonding characteristics.

Figure 2:
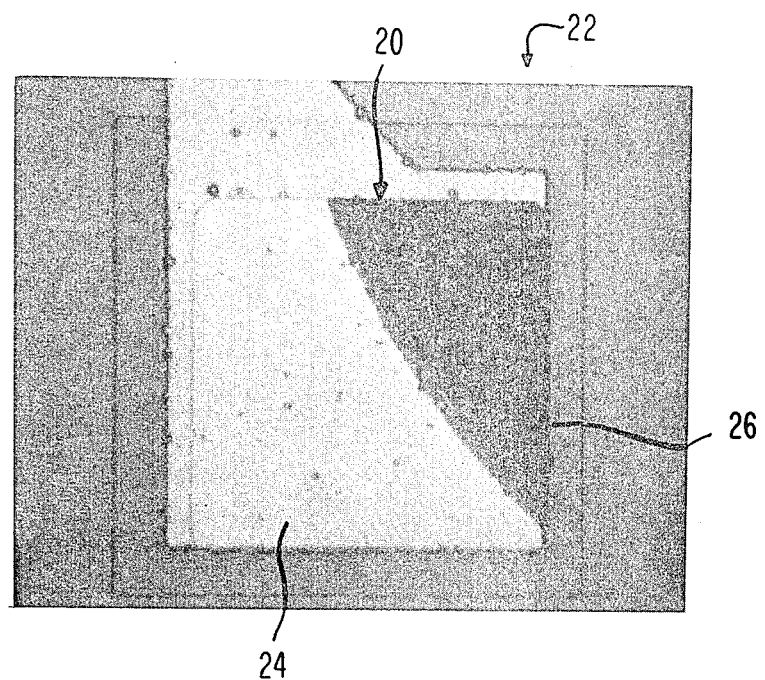
FIG. 2 is a microphotograph of an integrated circuit bond pad area showing an aluminum surface which has bad bonding qualities.

Referring now to FIG. 2, a bond pad 20, which is part of an integrated circuit 22, is shown. The bond pad 20, which is part of an integrated circuit 22, is shown. The bond pad 20 has a left portion 24 and a right portion 26. The left portion 24 was coated with a wax substance in order to prevent it from being exposed to the immersion plating solution. As shown in the microphotograph of FIG. 2, the right portion 26 was plated continuously with copper. The bond pad 20 will have poor bonding characteristics.

I have successfully tried a series of immersion plating solutions in carrying out my invention. The solutions may be made up as follows:

EXAMPLE 1

The first solution which I used consisted of 320 cc of de-ionized water (DI $H_2O$), 8 cc of 49% hydroflouric acid (HF), 8 cc sulfuric acid ($H_2SO_4$), and 8 g copper sulfate ($CuSO_4$—$H_2O$). The solution etched the aluminum layer at a rate of about 50 angstroms per second at room temperature and simultaneously plated copper onto the exposed silicon.

EXAMPLE 2

The second solution which I used consisted of 320 cc of de-ionized water (DI $H_2O$), 8 cc of 49% hydroflouric acid (HF), and 8 g of copper sulfate ($CuSO_4$—$H_2O$). The solution etched the aluminum layer at a rate of about 50 angstroms per second at room temperature and simultaneously plated copper onto the exposed silicon.

EXAMPLE 3

The third solution which I used consisted of 320 cc of de-ionized water (DI $H_2O$), 4 cc of 49% hydroflouric acid (HF), and 4 g of copper sulfate ($CuSO_4$—$H_2O$). The solution etched the aluminum layer at a rate of about 25 angstroms per second at room temperature and simultaneously plated copper onto the exposed silicon.

I claim:

1. A method for determining the silicon content in an aluminum film on a substrate comprising the steps of:
   (a) immersion plating said substrate in a solution comprising de-ionized water, hydrofluoric acid, and copper sulfate which will plate onto the silicon in the film while etching the aluminum film; then
   (b) removing said substrate from said solution and visually examining the aluminum film to determine whether the areas plated thereon are continuous or discontinuous.

2. The method of claim 1 wherein said solution consists of 320 cc of de-ionized water, 8 cc of 49% hydroflouric acid, 8 cc of sulfuric acid and 8 g of copper sulfate.

3. The method of claim 1 wherein said solution consists of 320 cc of de-ionized water, 8 cc of hydroflouric acid and 8 g of copper sulfate.

4. The method of claim 1 wherein said solution consists of 320 cc of de-ionized water, 4 cc of hydroflouric acid and 4 g of copper sulfate.

* * * * *